United States Patent [19]

Lu

[11] Patent Number: 5,043,611
[45] Date of Patent: Aug. 27, 1991

[54] THYRISTOR CONTROLLER

[76] Inventor: Chao-Cheng Lu, No. 4-4, Alley 27, Lane 143, Chun Kung Road, Taipei 11614, Taiwan

[21] Appl. No.: 405,328

[22] Filed: Sep. 11, 1989

[51] Int. Cl.$^5$ .................................................. H03K 17/72
[52] U.S. Cl. ...................................... 307/642; 307/305
[58] Field of Search .............. 307/633, 639, 642, 643, 307/305

[56] References Cited

U.S. PATENT DOCUMENTS 3,409,786 11/1968 Nemeth ............................... 307/639
4,007,398 2/1977 Nakamura et al. ................. 307/642

Primary Examiner—John Zazworsky
Attorney, Agent, or Firm—Fleit, Jacobson, Cohn, Price, Holman & Stern

[57] ABSTRACT

A new SCR (silicon controlled rectifier) controller characterized by comprising input circuits, SCR trigger circuits, charge circuits, commutation capacitor, discharge circuits and SCR and being constructed in such way that when the input pulse is positive, it will work to activate the trigger and cause the SCR to be in turn-on state as well as to charge the commutation capacitor and when the input pulse is zero, the stored energy of the commutation capacitor will discharge to cause the SCR to be in turn-off state so that it does not need any other electric energy to attain the objective to cut off the source.

3 Claims, 1 Drawing Sheet

THYRISTOR CONTROLLER

BACKGROUND OF THE INVENTION

There are lots of SCR turn-off methods but the SCR turn-off method of this invention obtained after long study and experiment is quite different from the conventional ones. Take the SCR serving as a D.C. Switch for example. When the SCR gate sends out a turn-on pulse voltage, the SCR is on and the commutation capacitor is charged to store the electric energy needed for turn-off. When the pulse voltage of the SCR gate is zero, the circuits of this invention use the stored energy to turn off the SCR. The turn-off action is very fast, almost as soon as the sending of the SCR gate off signal. The SCR turn off action does not produce any sparks and thus it is very safe. From the above, it is seen that by applying the transient charge of voltage to the gate, this invention makes the SCR in turn off state and attains the objective of cutting off the source.

SUMMARY OF THE INVENTION

The input control source of this invention may be of D.C. voltage, A.C. voltage or pulse voltage so that it can control the turn-on and turn-off action of the SCR with a little D.C. voltage, A.C. Voltage or pulse voltage.

The SCR trigger circuit of this invention has a diode in series with the SCR gate and a resistor between the gate end cathode of the SCR to control the turn-on and turn-off action of the SCR by taking use of the voltage change between the gate and the cathode.

The controller of this invention has a conventional SCR to serve as a main switch of the circuits.

The thyristor controller of this invention has charge circuits consisting of a diode, commutation capacitor, and SCR. When a positive pulse is put in, the SCR will be in turn-on state. At the same time, the positive pulse charges the diode and commutation capacitor at the positive terminals. With the anode and cathode of the SCR, the negative terminal forms charge circuits to make transient charge of the commutation capacitor.

The thyristor controller of this invention has discharge circuits consisting of inverter circuits, darlington circuits, commutation circuits and SCR. When the input pulse is zero and the output voltage of the inverter is positive, the Darlington circuits are in a saturation state. The positive electric charge of the commutation capacitor goes through the Darlington circuits and the cathode of the SCR to the anode of the SCR and discharges. At this time, the SCR changes from turn-on state to turn-off state and attains the objective of cutting off the source.

DETAILED DESCRIPTION OF THE PREFERRED EMBODIMENT

Figure 1:
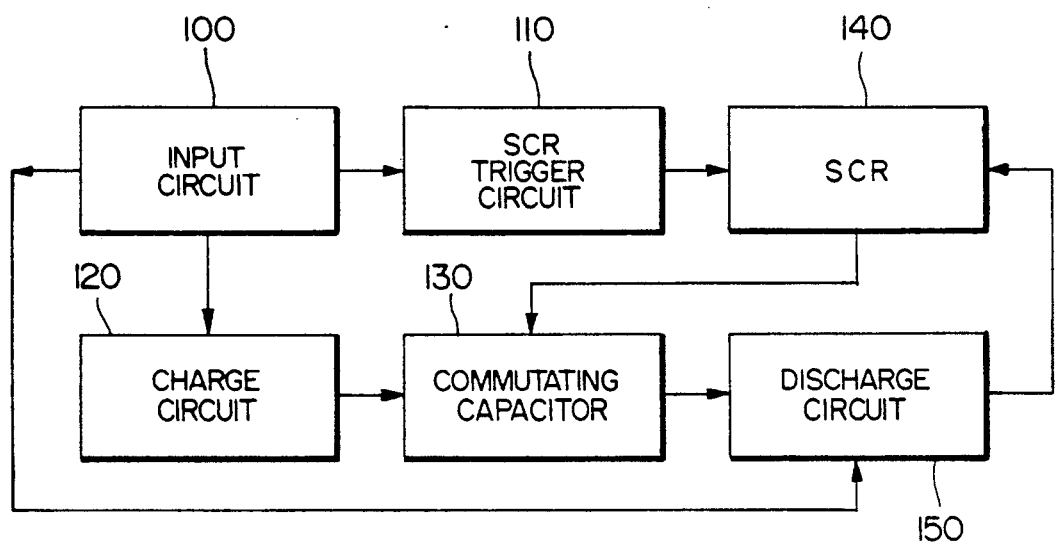
FIG. 1 is a block diagram of the Lu's Thyristor controller of this invention.

As shown in FIG. 1, the controller comprises an input circuit 100 connected to an SCR trigger circuit 110 and a charge circuit 120. The charge circuit 120 is connected to a commutating capacitor 130. The SCR trigger circuit 110 is connected to an SCR 140 which is itself connected to the commutating capacitor 130. A discharge circuit 150 is connected to the commutating capacitor 130 and the SCR 140.

Figure 2:
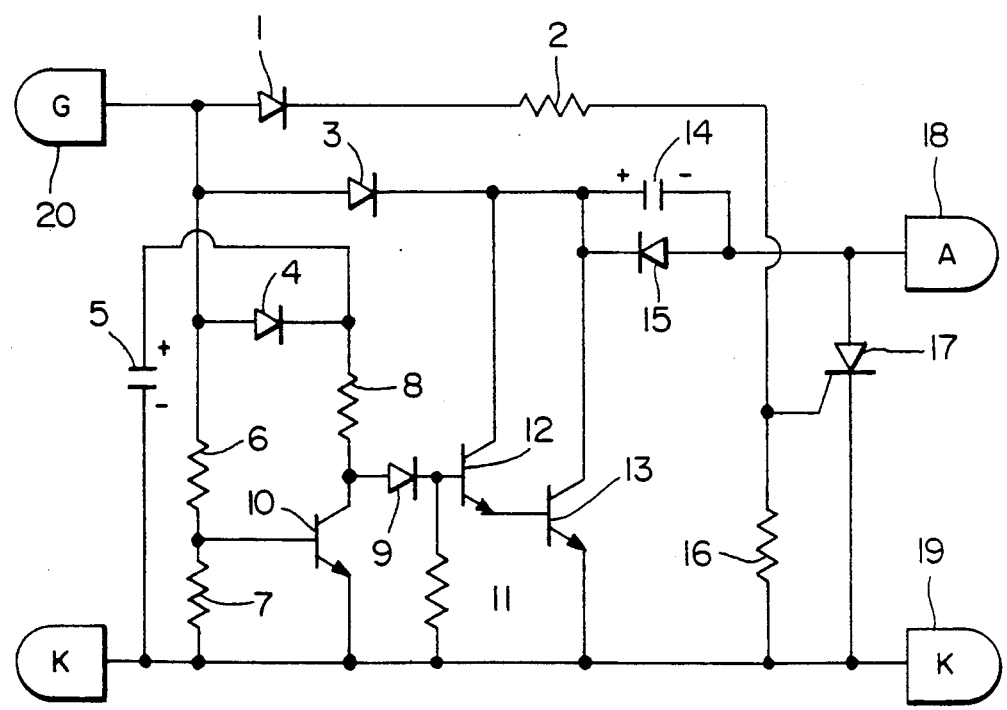
FIG. 2 is a circuit diagram of the said controller.

As shown in FIG. 2, when a pulse is sent to the terminal G of the thyristor controller of this invention, it is divided into four and sent to the diode 1, diode 3, diode 4, and current limiting resistor 6 at the input terminal of the inverter 10 respectively.

The positive pulse goes through the diode 1, current limiting resistor 2 to the gate of SCR 17 to make the SCR 17 to be in turn-on state and returns to the terminal K to form a turn-on circuit. The divider resistor 16 between the gate and cathode of the SCR 17 forms with the current limiting resistor 2 a divider circuit to provide the SCR 17 with appropriate turn-on voltage.

The positive pulse going through diode 3 charges the positive terminal of the commutation capacitor 14 of which the negative terminal is connected through the anode and cathode of the SCR 17 to the terminal K 19 of this invention. It must be noted that at this time, the SCR 17 has entered the turn-on state and completed the action of charging the commutation capacitor 14.

The positive pulse going through the diode 4 charges the capacitor 5 so that when the input of positive pulse changes to zero input, the inverter 10 can supply the Darlington circuits 12 and 13 with positive voltage temporarily.

The positive pulse going through the current limiting resistor 6 and the base and emitter of the inverter 10 places the inverter 10 in the saturation state. At this time, the voltage at the output terminal of the load resistor 8 is about 0.3-0.5 V depending on the transistor used. The voltage is sent out through the diode 9 to the base of the transistor 12 and the divider resistor 11. At this time, the potential of the base of the transistor 12 and the terminal K 19 is approximately zero. Therefore the Darlington circuits consisting of transistors 12 and 13 are in off state. The divider resistor 7 and current limiting resistor 6 form divider circuits to provide saturation voltage to the base and emitter of the inverter 10.

The terminal A 18 of this invention is connected to the positive terminal of the D.C. power supply and to the anode of SCR 17. The cathode of the SCR 17 is connected to the terminal K 19 which is connected to a load. Another terminal of the load is connected to the ground terminal of the D.C. power supply. Thus, the SCR 17 is formed to be the circuit of D.C. switch. When the terminal G 20 sends out a positive pulse, the SCR 17 will be on and when the potential of the terminal G 20 is zero, the SCR 17 will be off. When the positive pulse from the terminal G 20 goes through the diode 1, current limiting resistor 2 to the gate of the SCR 17 and causes the SCR to enter a turn-on state or to be on, the D.C. power supply supplies voltage to both load terminals and the on action of the SCR 17 as a D.C. switch is completed. Another positive pulse form diode 3 charges the commutation capacitor 14 at the positive terminal. The negative terminal of commutating capacitor 14 is connected through the anode and cathode of the SCR 17 to the terminal K19, which is already on, and the terminal A18 to form a charge circuit. Another positive pulse form the diode 4 charges the capacitor 5 and supplies voltage to the collector of the inverter 10. The resistor 8 is a load resistor of the inverter 10 which consists of transistors. Another positive pulse from the current limiting resistor 6 gives a voltage to the base and emitter of the inverter 10 and causes the base and emitter of the inverter 10 to be saturated. The voltage of the base and emitter is equal to that of the divider resistor 7. When the base and emitter of the inverter 10 are saturated, the output voltage of the collector of the inverter 10 is about 0.3–0.5 V. When the voltage goes through the diode 9 to the base of the transistor 12, the Darlington circuits consisting of transistors 12 and 13 are off and the input voltage of the Darlington circuit is equal to that of the divider resistor 11. When the input pulse is zero, the SCR 17 is changed from the state of turn-on to the state of turn-off and thus the SCR 17 acts as a D.C. switch. When the voltage across the diode 1 is zero, the voltage at the gate of the SCR 17 is zero. Because the diode 3 is a one way conducting diode, the voltage of the capacitor 14 does not go to the terminal G. When the voltage of the base of the inverter 10 is zero, the potential of the collector of the inverter 10 is positive. When the voltage goes through the diode 9 to the base of the transistor 12, the Darlington circuit is on and the positive potential of the commutation capacitor 14 returns through the collector and emitter of the transistor 13, the cathode and anode of the SCR 17, to the negative terminal of the commutation capacitor 14 and discharges there. This constitutes a discharge circuit and causes the SCR 17 to be off. At this time, no positive voltage of the D.C. power supply exists in the load terminal K 19. The diode 15 is designed to let the high D.C. voltage of the terminal A go through the diode 15, not the commutation capacitor 14, to the collector of the Darlington Circuit. When the commutation capacitor 14 discharges, the capacitor 5 discharges, too. And the time of discharge of the capacitor 5 is shorter than that of the commutation capacitor 14. When the commutation capacitor 14 finishes discharging, the SCR 17 enters the state of turn-off and cuts off the power supply.

What I claim is:

1. A thyristor controller for connecting and disconnecting a source from a circuit, the thyristor controller comprising:
   an input circuit for receiving a positive pulse charge, said input circuit comprising:
   first, second and third input diodes;
   an input terminal connected to said first, second and third input diodes, said input terminal receiving said positive pulse charge as an input signal; and
   a current limiting resistor connected in series with said first input diode;
   a thyristor having a gate connected to said current limiting resistor and capable of being in an ON state or an OFF state under control of said positive pulse charge;
   a commutation capacitor connected between said second input diode and an anode of said thyristor, said commutation capacitor charging in response to receipt of said positive pulse charge by said input circuit which turns on said thyristor in accordance with an appropriate turn-on voltage of the thyristor; and
   a discharge circuit connected to said third input diode and coupled to receive said positive pulse charge applied to said input circuit for discharging said commutation capacitor in response to the positive pulse charge going to zero to place said thyristor in the OFF state.

2. A thyristor controller as claimed in claim 1, wherein said discharge circuit comprises:
   an inverter circuit having a collector, an emitter and a base;
   a diode connected to said collector of said inverter circuit; and
   a Darlington circuit coupled to said inverter circuit through said diode.

3. A thyristor controller as claimed in claim 2, wherein said Darlington circuit comprises a plurality of transistors.

* * * * *